United States Patent
Tsai

(10) Patent No.: US 11,877,082 B2
(45) Date of Patent: *Jan. 16, 2024

(54) IMAGE SENSOR EMPLOYING AVALANCHE DIODE

(71) Applicant: PIXART IMAGING INC., Hsin-Chu County (TW)

(72) Inventor: Tso-Sheng Tsai, Hsin-Chu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/986,947

(22) Filed: Nov. 15, 2022

(65) Prior Publication Data

US 2023/0077016 A1    Mar. 9, 2023

Related U.S. Application Data

(60) Continuation of application No. 17/378,843, filed on Jul. 19, 2021, now Pat. No. 11,575,854, which is a division of application No. 16/872,626, filed on May 12, 2020, now Pat. No. 11,102,439, which is a division of application No. 16/258,673, filed on Jan. 28, 2019, now Pat. No. 10,715,756.

(51) Int. Cl.
| | |
|---|---|
| *H04N 25/75* | (2023.01) |
| *H01L 27/146* | (2006.01) |
| *H04N 25/76* | (2023.01) |
| *H01L 31/107* | (2006.01) |

(52) U.S. Cl.
CPC ....... *H04N 25/75* (2023.01); *H01L 27/14612* (2013.01); *H01L 27/14643* (2013.01); *H04N 25/76* (2023.01); *H01L 31/107* (2013.01)

(58) Field of Classification Search
None
See application file for complete search history.

(56) References Cited

U.S. PATENT DOCUMENTS

| | | |
|---|---|---|
| 11,245,865 B2 | 2/2022 | Huang et al. |
| 11,528,444 B2 | 12/2022 | Huang et al. |
| 2016/0119565 A1* | 4/2016 | Fujita ............... H04N 25/68 348/301 |

* cited by examiner

*Primary Examiner* — Mark T Monk
(74) *Attorney, Agent, or Firm* — Bruce Stone LLP; Joseph A. Bruce

(57) ABSTRACT

There is provided an image sensor employing an avalanche diode. The image sensor includes a plurality of pixel circuits arranged in a matrix, a plurality of pulling circuits and a global current source circuit. Each of the plurality of pixel circuits includes a single photon avalanche diode and four P-type or N-type transistors. Each of the plurality of pulling circuits is arranged corresponding to one pixel circuit column. The global current source circuit is used to form a current mirror with each of the plurality of pulling circuits.

19 Claims, 8 Drawing Sheets

IMAGE SENSOR EMPLOYING AVALANCHE DIODE

CROSS REFERENCE TO RELATED APPLICATION

This application is a continuation application of U.S. patent application Ser. No. 17/378,843, filed on Jul. 19, 2021, which is a divisional application of U.S. patent application Ser. No. 16/872,626, filed on May 12, 2020, which is a divisional application of U.S. patent application Ser. No. 16/258,673, filed on Jan. 28, 2019, the full disclosures of which are incorporated herein by reference.

To the extent any amendments, characterizations, or other assertions previously made (in this or in any related patent applications or patents, including any parent, sibling, or child) with respect to any art, prior or otherwise, could be construed as a disclaimer of any subject matter supported by the present disclosure of this application, Applicant hereby rescinds and retracts such disclaimer. Applicant also respectfully submits that any prior art previously considered in any related patent applications or patents, including any parent, sibling, or child, may need to be re-visited.

BACKGROUND

1. Field of the Disclosure

This disclosure generally relates to the photon detection technology and, more particularly, to an image sensor employing a single photon avalanche diode (SPAD) in the pixel circuit. The quenching and readout circuit of the SPAD has a low limitation on minimum pixel unit and a high fill factor.

2. Description of the Related Art

Single photon detection is a good choice in dealing with weak light environment and high frequency light signals.

For example, a single photon avalanche diode (SPAD) can be used as a detector for weak light, and has the benefits of high avalanche gain, fast response and low power consumption. When each photon is received by the SPAD, an avalanche current is triggered to respond that one photon is detected. A pulse generated by the avalanche current can be referred as an event.

However, the SPAD cannot accomplish the quenching by itself, and thus a quenching circuit is required in operation so as to quickly pull down a bias voltage of the SPAD to be lower than a breakdown voltage after an avalanche occurs. Then, the bias voltage is quickly pulled up to be higher than the breakdown voltage to cause the SPAD to return to a photon detecting state.

One requirement of the quenching circuit is not to decrease the fill factor.

One conventional method is to form an independent 3D quenching circuit outside a pixel circuit. Because the pixel circuit and the quenching circuit are not arranged in the same chip, the impact upon the fill factor is reduced.

Another conventional method is to use a logic circuit having a combination of p-type and N-type transistors to implement a quenching circuit. However, in this kind of quenching circuit, two Nwells having different potentials have to be formed within a signal pixel unit. Due to the design rules checking, a minimum distance should be maintained between the Nwells having different potentials that causes a limitation on the minimum pixel size.

Accordingly, it is necessary to provide a quenching circuit of the SPAD having a low limitation on minimum pixel unit and a high fill factor.

SUMMARY

The present disclosure provides an image sensor incorporating an SPAD within each pixel circuit, and the SPAD has a low limitation on minimum pixel size and a high fill factor.

The present disclosure provides an image sensor including a pixel array and a plurality of readout lines. The pixel array includes a plurality of pixel circuits arranged in a matrix. Each of the pixel circuits includes an avalanche diode, a resistive transistor, a first switch transistor, a pull down transistor and a second switch transistor. The avalanche diode has an anode and a cathode, and the cathode is connected to a positive bias voltage. A drain of the resistive transistor is connected to the anode of the avalanche diode, and a gate of the resistive transistor is configured to receive a fixed voltage signal. A drain of the first switch transistor is connected to a source of the resistive transistor, a gate of the first switch transistor is configured to receive an exposure signal, and a source of the first switch transistor is connected to a ground voltage. A gate of the pull down transistor is connected to the anode of the avalanche diode, and a source of the pull down transistor is connected to the ground voltage. A gate of the second switch transistor is configured to receive the exposure signal, a source of the second switch transistor is connected to a drain of the pull down transistor, and a drain of the second switch transistor is configured to generate an output voltage. Each readout line is coupled to the drain of the second switch transistor of each pixel circuit of one pixel circuit column to output the output voltage.

The present disclosure provides an image sensor including a pixel array and a plurality of readout lines. The pixel array includes a plurality of pixel circuits arranged in a matrix. Each of the pixel circuits includes an avalanche diode, a resistive transistor, a first switch transistor, a pull up transistor and a second switch transistor. The avalanche diode has an anode and a cathode, and the anode is connected to a negative bias voltage. A drain of the resistive transistor is connected to the cathode of the avalanche diode, and a gate of the resistive transistor is configured to receive a fixed voltage signal. A drain of the first switch transistor is connected to a source of the resistive transistor, a gate of the first switch transistor is configured to receive an exposure signal, and a source of the first switch transistor is connected to a system voltage. A gate of the pull up transistor is connected to the cathode of the avalanche diode, and a source of the pull up transistor is connected to the system voltage. A gate of the second switch transistor is configured to receive the exposure signal, a source of the second switch transistor is connected to a drain of the pull up transistor, and a drain of the second switch transistor is configured to generate an output voltage. Each readout line is coupled to the drain of the second switch transistor of each pixel circuit of one pixel circuit column to output the output voltage.

The present disclosure provides an image sensor including a pixel array and a plurality of readout lines. The pixel array includes a plurality of pixel circuits arranged in a matrix. Each of the pixel circuits includes an avalanche diode, a first transistor and a second transistor. The avalanche diode has an anode and a cathode, which is connected to a positive bias voltage. A gate of the first transistor is connected to the anode of the avalanche diode, and a source of the first transistor is connected to a ground voltage. A gate of the second transistor is configured to receive an exposure signal, a source of the second transistor is connected to a drain of the first transistor, and a drain of the second transistor is configured to generate an output voltage. Each readout line is coupled to the drain of the second transistor of each pixel circuit of one pixel circuit column to output the output voltage.

In the quenching and readout circuit of the SPAR of the present disclosure, each pixel only has N-type transistors or P-type transistors, and thus each pixel only has one Nwell.

In the image sensor of the present disclosure, as the pulling circuit is arranged outside of each pixel, it can neither become a limitation on the minimum pixel unit nor affect the fill factor.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

Figure 1:
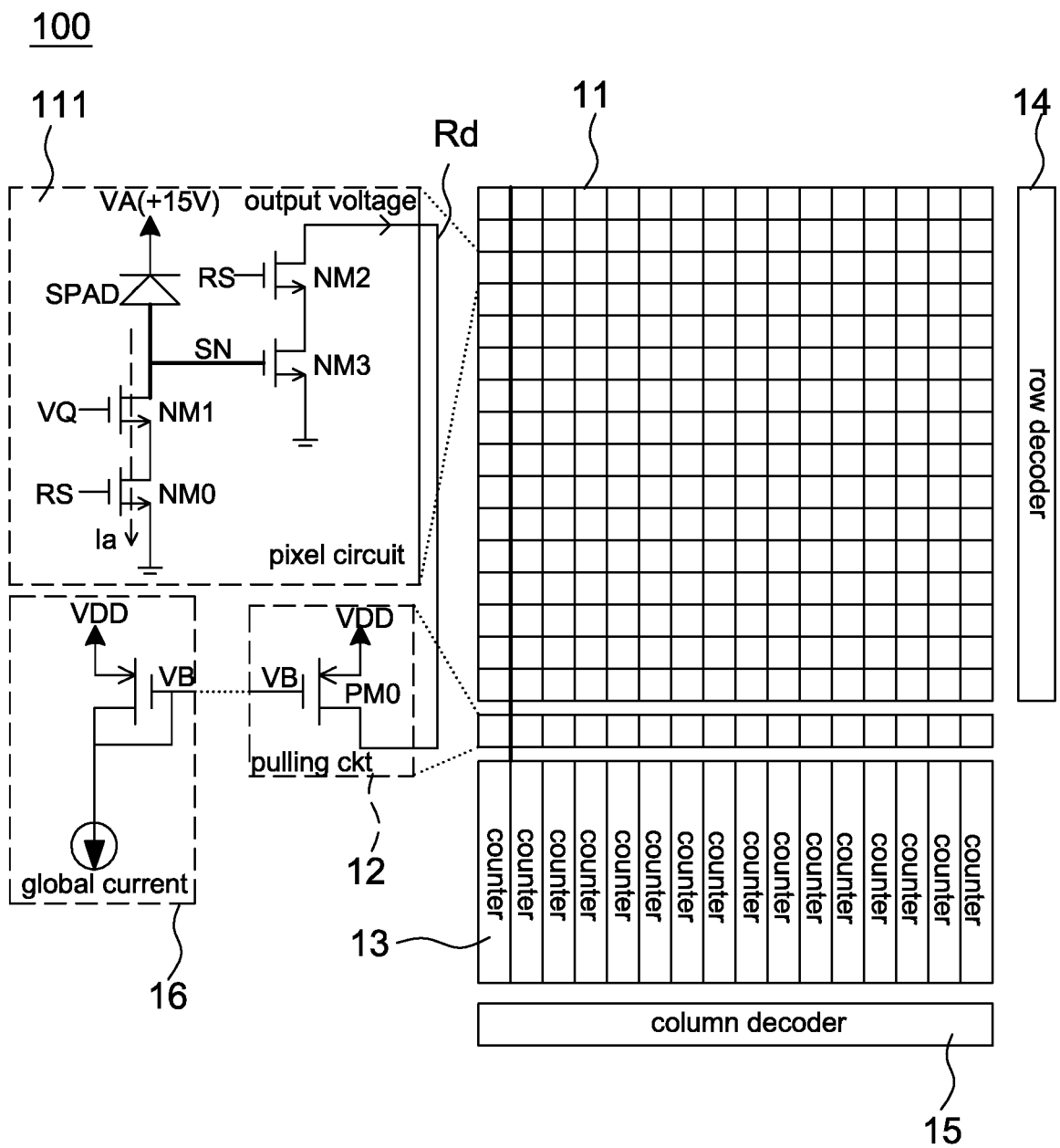
FIG. 1 is a schematic diagram of an image sensor according to a first embodiment of the present disclosure.

Referring to FIG. 1, it is a schematic diagram of an image sensor 100 according to a first embodiment of the present disclosure. The image sensor 100 is used to detect extremely weak light and high frequency signals, and thus a single photon avalanche diode (SPAD) is employed to detect photon events. A processor generates an image frame by counting photon events of every pixel to perform the object tracking, gesture recognition, 3D image construction, and biological feature detection and recognition.

The image sensor 100 includes a pixel array 11, a plurality of pulling circuits 12, a plurality of counters 13, a row decoder 14, a column decoder 15 and a global current source circuit 16, wherein the row decoder 14 and the column decoder 15 are used to determine a pixel position in the pixel array 11 that is being exposed and outputting a detected signal (e.g., pulses mentioned below). The operation of the row decoder 14 and the column decoder 15 is known to the art and is not a main objective of the present disclosure, and thus details thereof are not described herein.

The pixel array 11 includes a plurality of pixel circuits 111 (e.g., FIG. 1 showing 16×16 pixels as an example) arranged in a matrix. Each of the plurality of pixel circuits 111 has an avalanche diode SPAD and four N-type transistors including a resistive transistor NM1, a first switch transistor NM0, a pull down transistor NM3 and a second switch transistor NM2.

The avalanche diode SPAD is a single photon avalanche diode, and has an anode and a cathode. The cathode is connected to a positive bias voltage VA, e.g., +15V, but not limited to. The anode is connected to a node SN. When a voltage difference (or bias) between the cathode and the anode exceeds a breakdown voltage of the avalanche diode SPAD, an avalanche current Ia is generated. In the first embodiment, the resistive transistor NM1 and the first switch transistor NM0 of the pixel circuit 111 are used to form a quenching circuit, which causes the voltage difference between the cathode and the anode to be lower than the breakdown voltage for quenching when the avalanche diode SPAD generates the avalanche current Ia. The pull down transistor NM3 and the second switch transistor NM2 of the pixel circuit 111 are used to form a readout circuit, which reads an output voltage of the pixel circuit 111 to a corresponding column counter 13.

A drain of the resistive transistor NM1 is connected to the node SN to connect to the anode of the avalanche diode SPAD. A gate of the resistive transistor NM1 is used to receive a fixed voltage signal VQ and be turned on or off thereby. In the first embodiment, the resistive transistor NM1 is used to form a controllable resistor, and resistance of the controllable resistor is determined according to a voltage value of the fixed voltage signal VQ. When the avalanche diode SPAD receives a photon in the detecting state and the first switch transistor NM0 is conducted, a voltage drop is formed on the resistive transistor NM1 to cause the voltage difference between the cathode and the anode of the avalanche diode SPAD to be lower than the breakdown voltage for the quenching.

A drain of the first switch transistor NM0 is connected to a source of the resistive transistor NM1. A gate of the first switch transistor NM0 is used to receive an exposure signal RS, which is a row selection signal and, for example, generated by the row decoder 14. A source of the first switch transistor NM0 is connected to a ground voltage.

A gate of the pull down transistor NM3 is connected to the node SN to connect to the anode of the avalanche diode SPAD. A source of the pull down transistor NM3 is connected to the ground voltage. The pull down transistor NM3 is used as a discharging path of a voltage on the node SN, and a discharging speed is determined according to resistance of the resistive transistor NM1 and stray capacitance of the circuit. The resistance and the stray capacitance are values determined in circuit manufacturing.

A gate of the second switch transistor NM2 also receives the exposure signal RS, and controlled by the exposure signal RS to be turned on or off together with the first switch transistor NM0. A source of the second switch transistor NM2 is connected to a drain of the pull down transistor NM3. A drain of the second switch transistor NM2 is used to generate an output voltage of the associated pixel circuit 111.

Each of the plurality of pulling circuits 12 is used to connect to the drain of the second switch transistor NM2 of each pixel circuit 111 in one pixel circuit column via a readout line Rd for reading the output voltage. For example, the image sensor 100 further includes a multiplexer or multiple switching devices to allow the pulling circuit 12 corresponding to each pixel circuit column to be connected to different pixel circuits 111 via the multiplexer of different switching devices. In the first embodiment, each of the pulling circuits 12 includes a P-type transistor PM0 used to pull up the output voltage after reading out a pulse in the output voltage (illustrated by an example below). A drain of the P-type transistor PM0 is connected to the drain of the second switch transistor NM2. A source of the P-type transistor PM0 is connected to a system voltage VDD, which is identical to or different from the positive bias voltage VA. A gate of the P-type transistor PM0 is used to receive a control signal VB.

The global current source circuit 16 is used to form a current mirror with each of the plurality of pulling circuits 12. The image sensor 100 is arranged with only one global current source circuit 16. For example, the image sensor 100 further includes a multiplexer or multiple switching devices to allow the global current source circuit 16 to be coupled to different pulling circuits 12 via the multiplexer or different switching devices. The global current source circuit 16 includes a P-type transistor whose drain and gate are connected together and connected to a global current source. A source of the P-type transistor is connected to the system voltage VDD.

Each of the plurality of counters 13 is coupled to one pixel circuit column for counting photon events in the output voltage from each pixel circuit 111 of the coupled pixel circuit column.

Figure 2:
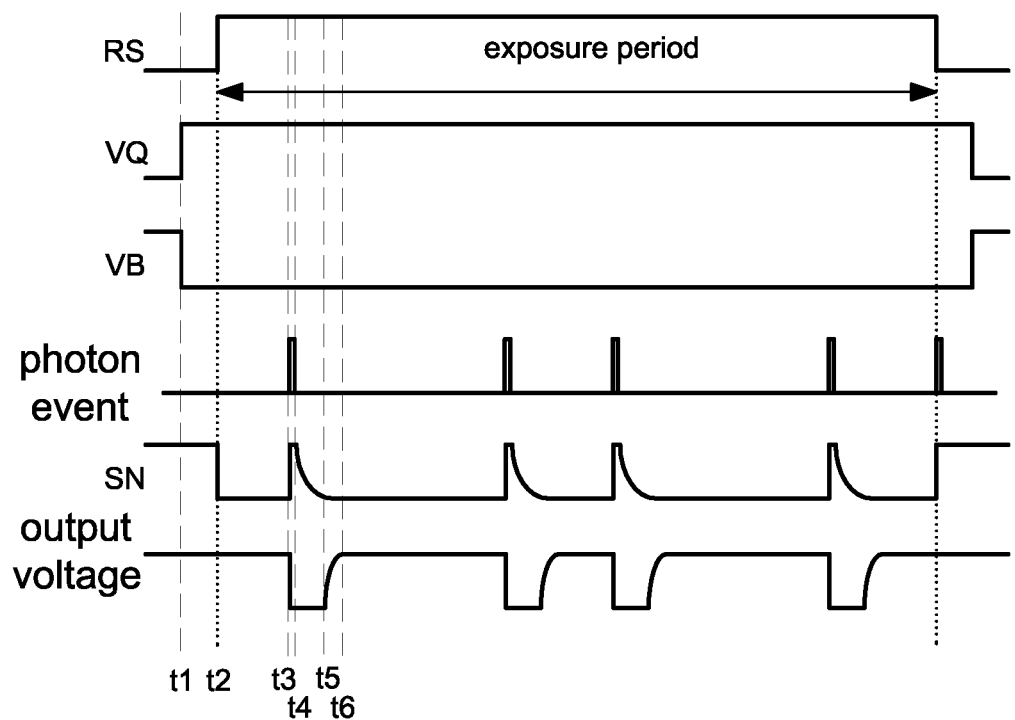
FIG. 2 is an operational timing diagram of an image sensor according to a first embodiment of the present disclosure.
Figure 3:
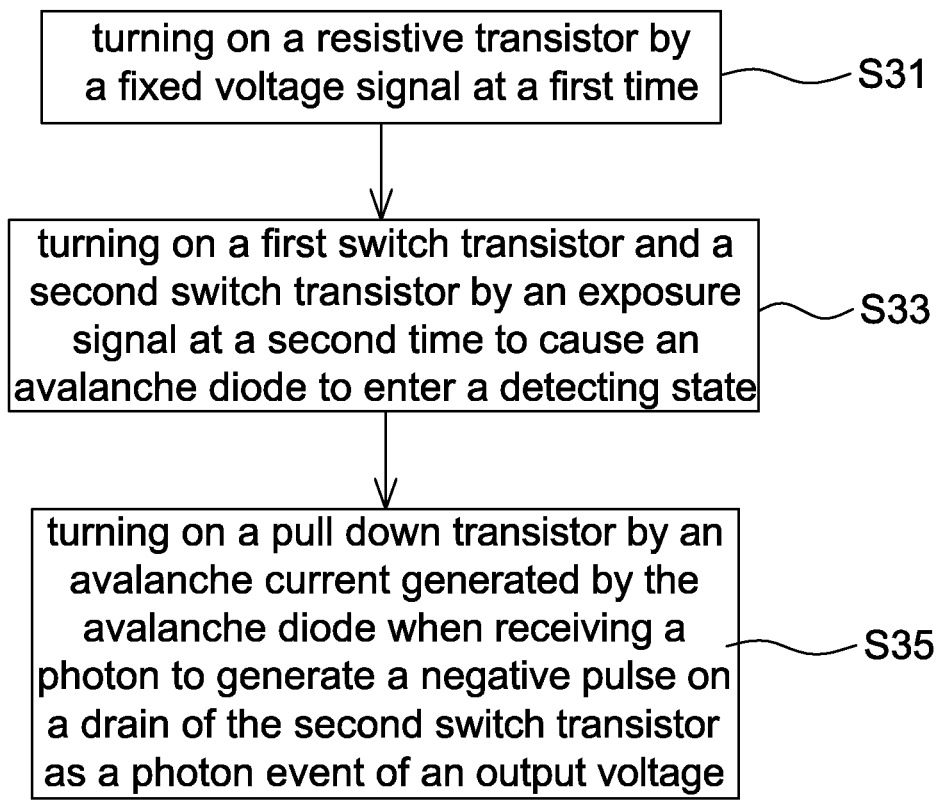
FIG. 3 is a flow chart of an image sensor according to a first embodiment of the present disclosure.

Referring to FIGS. 2 and 3, FIG. 2 is an operational timing diagram of an image sensor 100 according to a first embodiment of the present disclosure; and FIG. 3 is a flow chart of an image sensor 100 according to a first embodiment of the present disclosure. The operating method of the image sensor 100 includes: turning on a resistive transistor by a fixed voltage signal at a first time (Step S31); turning on a first switch transistor and a second switch transistor by an exposure signal at a second time to cause an avalanche diode to enter a detecting state (Step S33); and turning on a pull down transistor by an avalanche current generated by the avalanche diode when receiving a photon to generate a negative pulse on a drain of the second switch transistor as a photon event of an output voltage (Step S35).

Referring to FIGS. 1 to 3 together, details of this operating method are illustrated below. Although this operating method illustrates the operation of one pixel circuit 111, it is appreciated that every pixel circuit 111 in the same pixel circuit column has an operation identical to FIGS. 2 and 3 only occurring at a different time based on the row selection signal.

Step S31: At a first time t1, the fixed voltage signal VQ is switched to a high voltage level to turn on the resistive transistor NM1 of a pixel circuit 111. Meanwhile, as the first switch transistor NM0 is not turned on yet, a voltage drop is not generated on the resistive transistor NM1. At the first time t1, the control signal VB is switched to a low voltage level to turn on the P-type transistor of the pulling circuit 12 (now the pulling circuit 12 being coupled to the corresponding pixel circuit 111 via a switching device or multiplexer).

Step S33: At a second time t2, the exposure signal RS is switched to a high voltage level to turn on the first switch transistor NM0 and the second switch transistor NM2 together. In the first embodiment, a high level interval of the exposure signal RS is referred to an exposure period within which each photon event is counted by the column counter 13. After the first switch transistor NM0 is conducted, as the resistive transistor NM1 has been turned on at the first time t1, a voltage on the node SN is pulled down to a low voltage level. In the first embodiment, the first time t1 is prior to the second time t2 by a predetermined interval as a setting interval of the resistive transistor NM1. In addition, during an interval between the second time t2 and the time t3, although the second switch transistor NM2 is conducted, the output voltage is still kept at a high voltage level because the pull down transistor NM3 is not turned on yet.

Step S35: Within the exposure period, the SPAD is in the detecting state when the avalanche diode SPAD does not receive any photon (e.g., an interval between t2 and t3 in FIG. 2), wherein the voltage on the node SN and the output voltage are respectively kept at a low voltage level and a high voltage level. When the avalanche diode SPAD receives a photon (e.g., at time t3 in FIG. 2), the avalanche diode SPAD generates an avalanche current Ia flowing through the resistive transistor NM1 to form a voltage drop thereon to cause the voltage on the node SN to change to a high voltage level to turn on the pull down transistor NM3. Meanwhile, the drain of the second switch transistor NM2 is connected to the ground via the second switch transistor NM2 and the pull down transistor NM3 to cause the output voltage to generate a negative pulse as a photon event of the output voltage. Meanwhile, as the voltage on the node SN is changed to a high voltage level to cause the voltage difference between the cathode and the anode of the avalanche diode SPAD to be smaller than the breakdown voltage, the quenching is started.

Next, the voltage on the node SN starts to discharge at time t4 via the pull down transistor NM3, and the pull down transistor NM3 is automatically turned off (e.g., at time t5 in FIG. 2) after a discharge interval, and the avalanche diode SPAD returns to a detecting state, wherein said discharge interval is determined according to the resistance of the resistive transistor NM1 and the stray capacitance of the circuit. As mentioned above, said resistance of the resistive transistor NM1 and the stray capacitance are determined in a circuit design stage so as to determine a time interval of the avalanche diode SPAD returning to the detecting state.

Finally, after the pull down transistor NM3 is automatically turned off, the pulling circuit 12 pulls up the output voltage back to a high voltage level to return to an original level at time t6. In this way, one quenching and reading cycle is accomplished.

Figure 6:
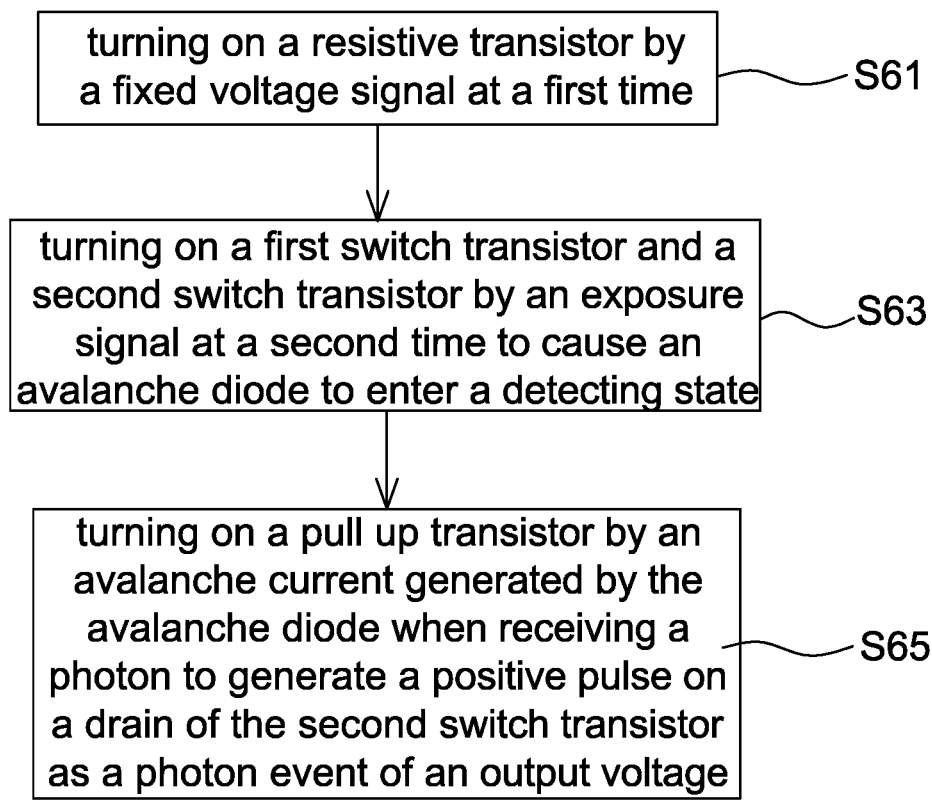
FIG. 6 is a flow chart of an image sensor according to a second embodiment of the present disclosure.

During an exposure period, corresponding to each incident photon, the operation of the pixel circuit 111 repeats the process from the first time t1 to time t6 in FIG. 6. For example, the counter 13 counts four negative pulses as the detection result within the exposure period in FIG. 2.

Figure 4:
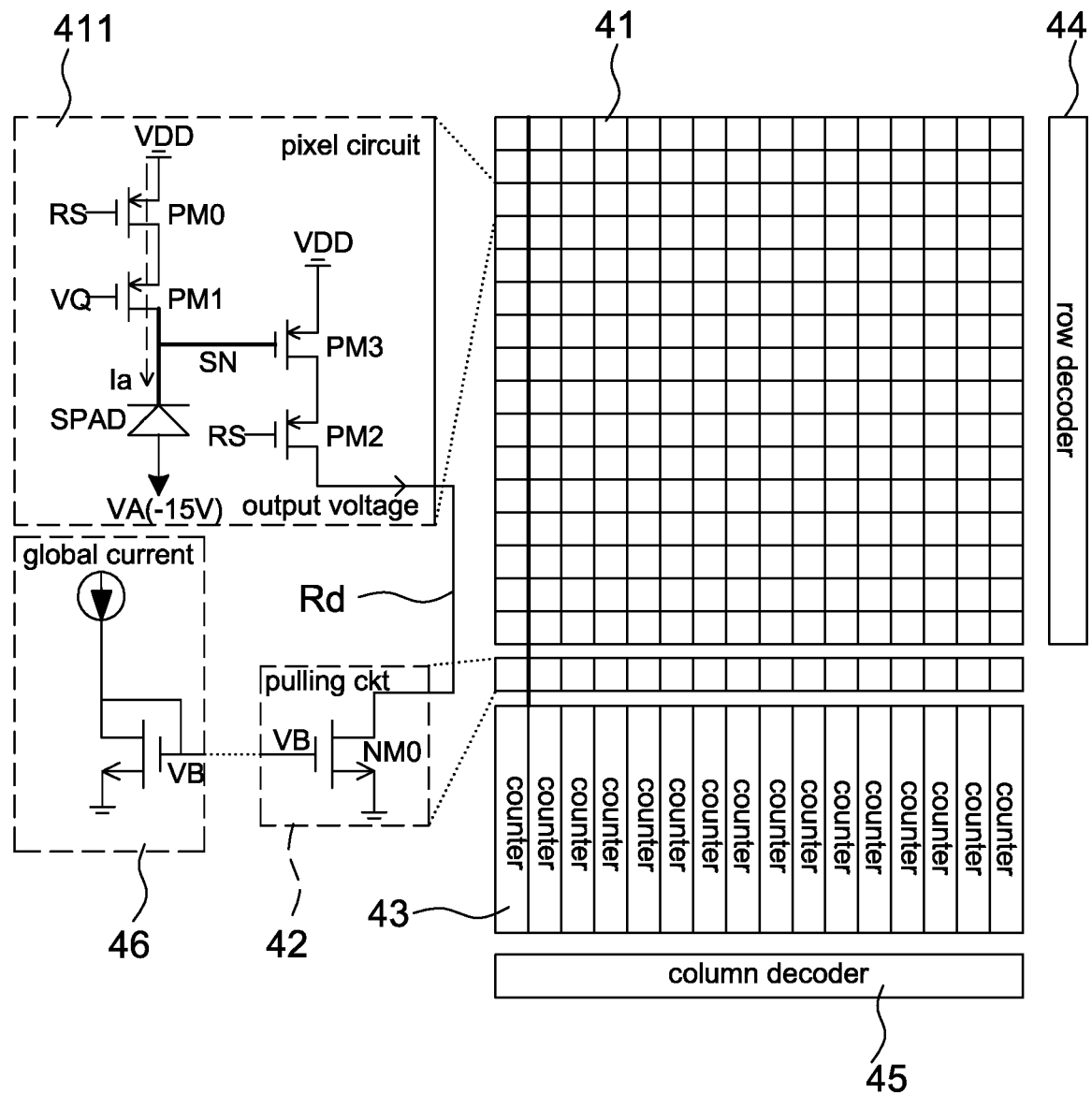
FIG. 4 is a schematic diagram of an image sensor according to a second embodiment of the present disclosure.

Referring to FIG. 4, it is a schematic diagram of an image sensor 400 according to a second embodiment of the present disclosure. The image sensor 400 is also used to detect extremely weak light and high frequency signals, and thus a single photon avalanche diode (SPAD) is employed to detect photon events. A processor generates an image frame by counting photon events of every pixel to perform the object tracking, gesture recognition, 3D image construction, and biological feature detection and recognition.

The image sensor 400 includes a pixel array 41, a plurality of pulling circuits 42, a plurality of counters 43, a row decoder 44, a column decoder 45 and a global current source circuit 46, wherein the row decoder 44 and the column decoder 45 are also used to determine a pixel position in the pixel array 41 that is being exposed and outputting a detected signal (e.g., pulses mentioned below).

The pixel array 41 includes a plurality of pixel circuits 411 (e.g., FIG. 4 also showing 16×16 pixels as an example) arranged in a matrix. Each of the plurality of pixel circuits 411 has an avalanche diode SPAD and four P-type transistors including a resistive transistor PM1, a first switch transistor PM0, a pull up transistor PM3 and a second switch transistor PM2.

The avalanche diode SPAD is a single photon avalanche diode, and has an anode and a cathode. The anode is connected to a negative bias voltage VA, e.g., −15V, but not limited to. The cathode is connected to a node SN. When a voltage difference (or bias) between the cathode and the anode exceeds a breakdown voltage of the avalanche diode SPAD, an avalanche current Ia is generated. In the second embodiment, the resistive transistor PM1 and the first switch transistor PM0 of the pixel circuit 411 are used to form a quenching circuit, which causes the voltage difference between the cathode and the anode to be lower than the breakdown voltage for quenching when the avalanche diode SPAD generates the avalanche current Ia. The pull up transistor PM3 and the second switch transistor PM2 of the pixel circuit 411 are used to form a readout circuit, which reads an output voltage of the pixel circuit 411 to a corresponding column counter 43.

A drain of the resistive transistor PM1 is connected to the node SN to connect to the cathode of the avalanche diode SPAD. A gate of the resistive transistor PM1 is used to receive a fixed voltage signal VQ and be turned on or off thereby. In the second embodiment, the resistive transistor PM1 is used to form a controllable resistor, and resistance of the controllable resistor is determined according to a voltage value of the fixed voltage signal VQ. When the avalanche diode SPAD receives a photon in the detecting state and the first switch transistor PM0 is conducted, a voltage drop is formed on the resistive transistor PM1 to cause the voltage difference between the cathode and the anode of the avalanche diode SPAD to be lower than the breakdown voltage for the quenching.

A drain of the first switch transistor PM0 is connected to a source of the resistive transistor PM1. A gate of the first switch transistor PM0 is used to receive an exposure signal RS, which is a row selection signal and, for example, generated by the row decoder 44. A source of the first switch transistor PM0 is connected to a system voltage VDD.

A gate of the pull up transistor PM3 is connected to the node SN to connect to the cathode of the avalanche diode SPAD. A source of the pull up transistor PM3 is connected to the system voltage VDD. The pull up transistor PM3 is used as a charging path of a voltage on the node SN, and a charging speed is determined according to resistance of the resistive transistor PM1 and stray capacitance of the circuit. The resistance and the stray capacitance are values determined in circuit manufacturing.

A gate of the second switch transistor PM2 also receives the exposure signal RS, and controlled by the exposure signal RS to be turned on or off together with the first switch transistor PM0. A source of the second switch transistor PM2 is connected to a drain of the pull up transistor PM3. A drain of the second switch transistor PM2 is used to generate an output voltage of the associated pixel circuit 411.

Each of the plurality of pulling circuits 42 is used to connect to the drain of the second switch transistor PM2 of each pixel circuit 411 in one pixel circuit column via a readout line Rd for reading the output voltage. For example, the image sensor 400 further includes a multiplexer or multiple switching devices to allow the pulling circuit 42 corresponding to each pixel circuit column to be connected to different pixel circuits 411 via the multiplexer of different switching devices. In the second embodiment, each of the pulling circuits 42 includes an N-type transistor NM0 used to pull down the output voltage after reading out a pulse in the output voltage (illustrated by an example below). A drain of the N-type transistor NM0 is connected to the drain of the second switch transistor PM2. A source of the N-type transistor NM0 is connected to a ground voltage. A gate of the N-type transistor NM0 is used to receive a control signal VB.

The global current source circuit 46 is used to form a current mirror with each of the plurality of pulling circuits 42. The image sensor 400 is arranged with only one global current source circuit 46. For example, the image sensor 400 further includes a multiplexer or multiple switching devices to allow the global current source circuit 46 to be coupled to different pulling circuits 42 via the multiplexer or different switching devices. The global current source circuit 46 includes an N-type transistor whose drain and gate are connected together and connected to a global current source. A source of the N-type transistor is connected to the ground voltage.

Each of the plurality of counters 43 is coupled to one pixel circuit column for counting photon events in the output voltage from each pixel circuit 411 of the coupled pixel circuit column.

Figure 5:
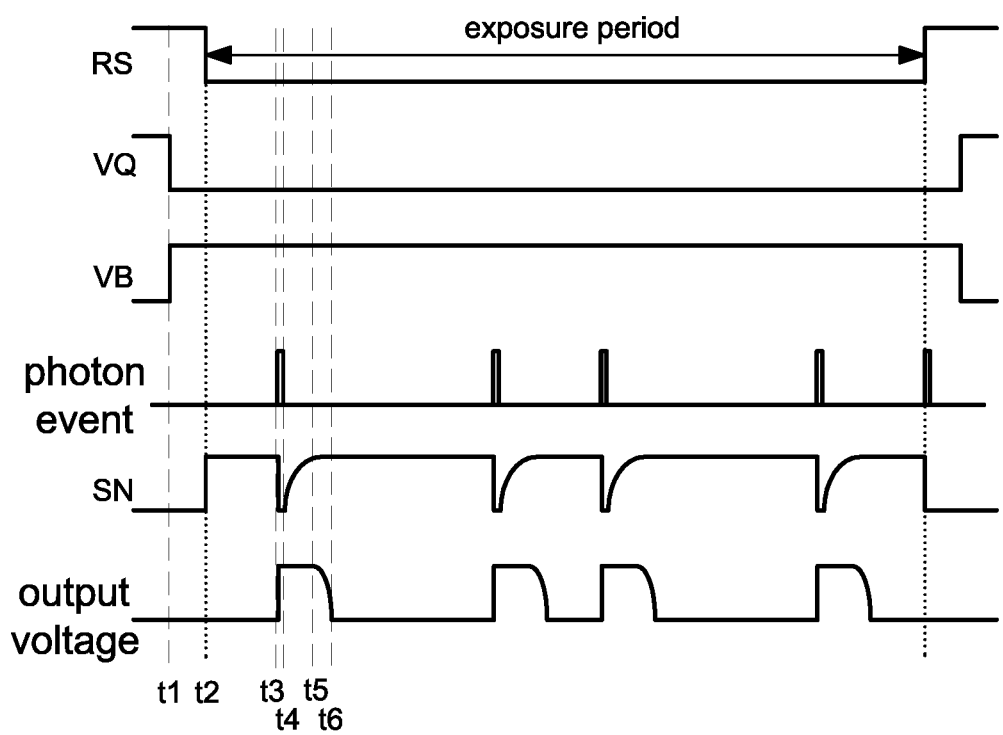
FIG. 5 is an operational timing diagram of an image sensor according to a second embodiment of the present disclosure.

Referring to FIGS. 5 and 6, FIG. 5 is an operational timing diagram of an image sensor 400 according to a second embodiment of the present disclosure; and FIG. 6 is a flow chart of an image sensor 400 according to a second embodiment of the present disclosure. The operating method of the image sensor 400 includes: turning on a resistive transistor by a fixed voltage signal at a first time (Step S61); turning on a first switch transistor and a second switch transistor by an exposure signal at a second time to cause an avalanche diode to enter a detecting state (Step S63); and turning on a pull up transistor by an avalanche current generated by the avalanche diode when receiving a photon to generate a positive pulse on a drain of the second switch transistor as a photon event of an output voltage (Step S65).

Referring to FIGS. 4 to 6 together, details of this operating method are illustrated below. Although this operating method illustrates the operation of one pixel circuit 411, it is appreciated that every pixel circuit 411 in the same pixel circuit column has an operation identical to FIGS. 5 and 6 only occurring at a different time based on the row selection signal.

Step S61: At a first time t1, the fixed voltage signal VQ is switched to a low voltage level to turn on the resistive transistor PM1 of a pixel circuit 411. Meanwhile, as the first switch transistor PM0 is not turned on yet, a voltage drop is not generated on the resistive transistor PM1. At the first time t1, the control signal VB is switched to a high voltage level to turn on the N-type transistor of the pulling circuit 42 (now the pulling circuit 42 being coupled to the corresponding pixel circuit 411 via a switching device or multiplexer).

Step S63: At a second time t2, the exposure signal RS is switched to a low voltage level to turn on the first switch transistor PM0 and the second switch transistor PM2 together. In the second embodiment, a low level interval of the exposure signal RS is referred to an exposure period within which each photon event is counted by the column counter 43. After the first switch transistor PM0 is conducted, as the resistive transistor PM1 has been turned on at the first time t1, a voltage on the node SN is pulled up to a high voltage level. In the second embodiment, the first time t1 is prior to the second time t2 by a predetermined interval as a setting interval of the resistive transistor PM1. In addition, during an interval between the second time t2 and the time t3, although the second switch transistor PM2 is conducted, the output voltage is still kept at a low voltage level because the pull up transistor PM3 is not turned on yet.

Step S65: Within the exposure period, the SPAD is in the detecting state when the avalanche diode SPAD does not receive any photon (e.g., an interval between t2 and t3 in FIG. 5), wherein the voltage on the node SN and the output voltage are respectively kept at a high voltage level and a low voltage level. When the avalanche diode SPAD receives a photon (e.g., at time t3 in FIG. 5), the avalanche diode SPAD generates an avalanche current Ia flowing through the resistive transistor PM1 to form a voltage drop thereon to cause the voltage on the node SN to change to a low voltage level to turn on the pull up transistor PM3. Meanwhile, the drain of the second switch transistor NM2 is connected to the system voltage VDD via the second switch transistor PM2 and the pull up transistor PM3 to cause the output voltage to generate a positive pulse as a photon event of the output voltage. Meanwhile, as the voltage on the node SN is changed to a low voltage level to cause the voltage difference between the cathode and the anode of the avalanche diode SPAD to be smaller than the breakdown voltage, the quenching is started.

Next, the voltage on the node SN starts to be charged at time t4 via the pull up transistor PM3, and the pull up transistor PM3 is automatically turned off (e.g., at time t5 in FIG. 5) after a charge interval, and the avalanche diode SPAD returns to a detecting state, wherein said charge interval is determined according to the resistance of the resistive transistor PM1 and the stray capacitance of the circuit. As mentioned above, said resistance of the resistive transistor PM1 and the stray capacitance are determined in a circuit design stage so as to determine a time interval of the avalanche diode SPAD returning to the detecting state.

Finally, after the pull up transistor PM3 is automatically turned off, the pulling circuit 42 pulls down the output voltage back to a low voltage level to return to an original level at time t6. In this way, one quenching and reading cycle is accomplished.

During an exposure period, corresponding to each incident photon, the operation of the pixel circuit 411 repeats the process from the first time t1 to time t6 in FIG. 6. For example, the counter 43 counts four positive pulses as the detection result within the exposure period in FIG. 5.

Figure 7:
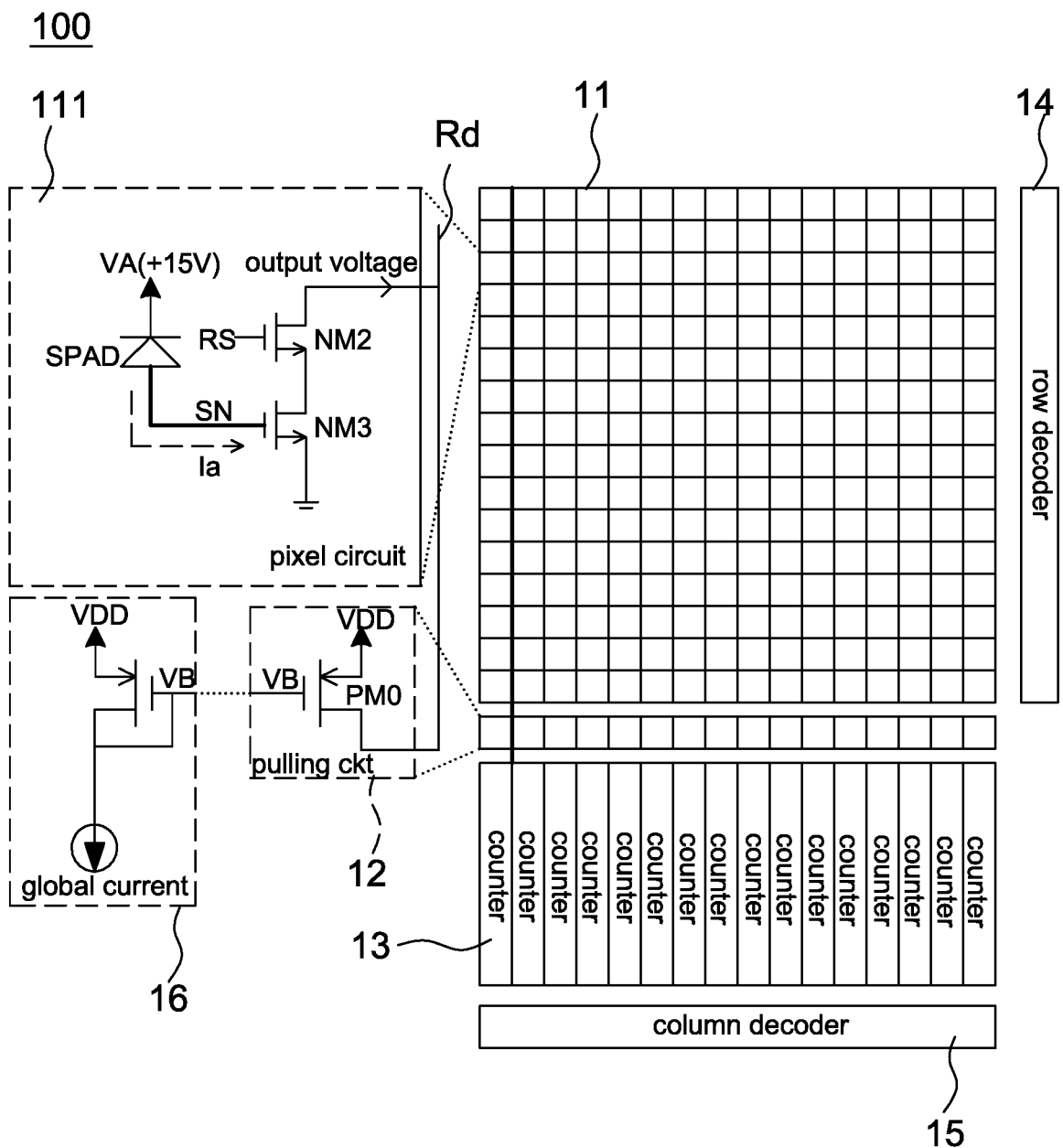
FIG. 7 is a schematic diagram of an image sensor according to a third embodiment of the present disclosure.
Figure 8:
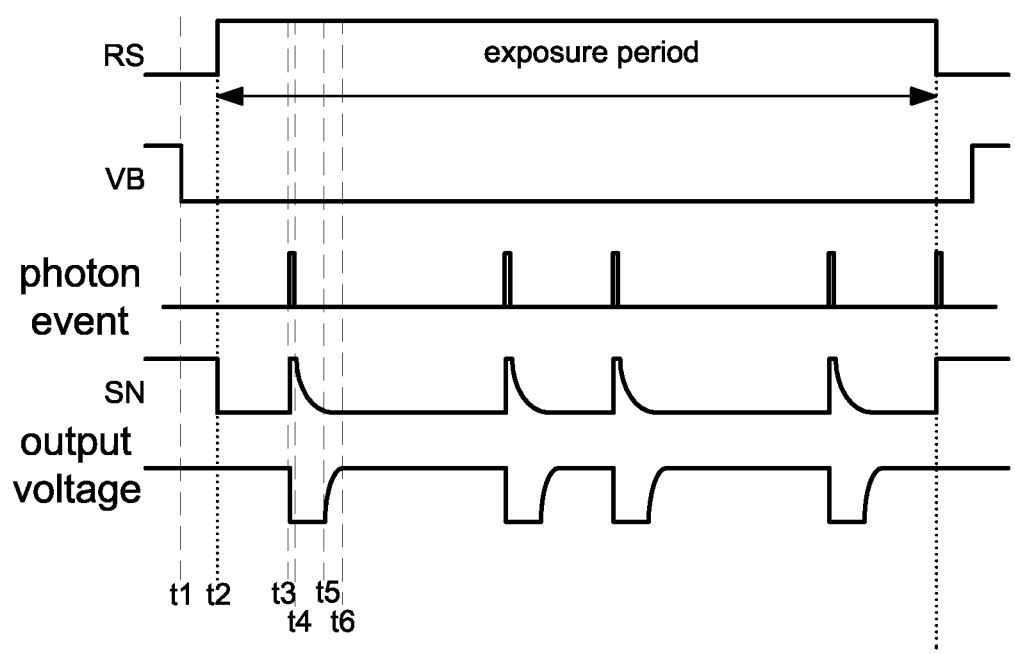
FIG. 8 is an operational timing diagram of an image sensor according to a third embodiment of the present disclosure.

Although the first and second embodiments mentioned above are described in the way that each pixel circuit includes four transistors, the present disclosure is not limited thereto. Referring to FIGS. 7 and 8, FIG. 7 is a schematic diagram of an image sensor 100 according to a third embodiment of the present disclosure; and FIG. 8 is an operational timing diagram of an image sensor 100 according to a third embodiment of the present disclosure.

In the third embodiment, the image sensor 100 also includes a pixel array 11, a plurality of pulling circuits 12, a plurality of counters 13, a row decoder 14, a column decoder 15 and a global current source circuit 16. The pixel array 11 also includes a plurality of pixel circuits 111.

Each pixel circuit 111 includes an avalanche diode SPAD and at least a transistor NM3. A cathode of SPAD is connected to a positive bias voltage VA, e.g., +15V, but not limited to. An anode of SPAD is connected to a node SN that connects to a gate of the transistor NM3. Each of the plurality of pulling circuits 12 is configured to be coupled to a drain of the transistor NM2 of each pixel circuit 111 of one pixel circuit column via a readout line Rd.

Furthermore, to control the pixel circuit 111 in one pixel circuit column to detect a photo event sequentially, each pixel circuit 111 further includes another transistor NM2 connected between the transistor NM3 and the readout line Rd. Operations of the image sensor 100 is shown in FIG. 8 and similar to that of the first embodiment, only without the transistors NM1 and NM0, and thus details thereof are not repeated herein. Functions of the plurality of pulling circuits 12, the plurality of counters 13, the row decoder 14, the column decoder 15 and the global current source circuit 16 are identical to those of the first embodiment.

It is appreciated that numbers mentioned in the above embodiment, such as the pixel number and pulse number are only intended to illustrate but not to limit the present disclosure.

In addition, the high and low voltage levels mentioned in the above embodiments are selected properly without particular limitations as long as every element operates normally. Meanwhile, the fixed voltage value VQ is referred to a voltage value thereof is maintained constant during the exposure period.

As mentioned above, although the SPAD can be used to detect extremely weak light and high frequency signals, it still needs to operate in corporation with the quenching circuit. Poor circuit design can influence the minimum pixel size and fill factor. Accordingly, the present disclosure further provides an image sensor, the quenching and readout circuit thereof (e.g., FIGS. 1 and 4) and an operating method of the image sensor (e.g., FIGS. 2-3 and 5-6) that have simple circuit structure, low pixel size limitation and high fill factor.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:
1. An image sensor, comprising:
  a pixel array comprising a plurality of pixel circuits arranged in a matrix, each of the pixel circuits comprising:
    an avalanche diode having an anode and a cathode, the cathode being connected to a positive bias voltage;
    a resistive transistor, a drain of the resistive transistor connected to the anode of the avalanche diode, and a gate of the resistive transistor configured to receive a fixed voltage signal;
    a first switch transistor, a drain of the first switch transistor connected to a source of the resistive transistor, a gate of the first switch transistor configured to receive an exposure signal, and a source of the first switch transistor connected to a ground voltage;
    a pull down transistor, a gate of the pull down transistor connected to the anode of the avalanche diode, and a source of the pull down transistor connected to the ground voltage; and
    a second switch transistor, a gate of the second switch transistor configured to receive the exposure signal, a source of the second switch transistor connected to a drain of the pull down transistor, and a drain of the second switch transistor configured to generate an output voltage; and
  a plurality of readout lines each being coupled to the drain of the second switch transistor of each pixel circuit of one pixel circuit column to output the output voltage.

2. The image sensor as claimed in claim 1, wherein the resistive transistor, the first switch transistor, the pull down transistor and the second switch transistor are N-type transistors.

3. The image sensor as claimed in claim 2, wherein the photon event is the drain of the second switch transistor being connected to the ground voltage via the second switch transistor and the pull down transistor to generate a negative pulse on the output voltage.

4. The image sensor as claimed in claim 1, further comprising a plurality of pulling circuits and a global current source circuit, which is configured to form a current mirror with each of the pulling circuits, wherein each of the pulling circuits is coupled to the each readout line for pulling up the output voltage after a photon event of the output voltage is read.

5. The image sensor as claimed in claim 4, wherein the global current source circuit is coupled to different pulling circuits via a multiplexer or via different switching devices.

6. The image sensor as claimed in claim 1, further comprising a plurality of counters each being coupled to the one pixel circuit column and configured to count photon events of the output voltage.

7. The image sensor as claimed in claim 1, wherein
the exposure signal is a row selection signal, and
the fixed voltage signal is used to determine resistance of the resistive transistor.

8. The image sensor as claimed in claim 4, wherein each of the pulling circuits is coupled to the each pixel circuit of the one pixel circuit column further via a switching device or a multiplexer.

9. An image sensor, comprising:
a pixel array comprising a plurality of pixel circuits arranged in a matrix, each of the pixel circuits comprising:
an avalanche diode having an anode and a cathode, the anode being connected to a negative bias voltage;
a resistive transistor, a drain of the resistive transistor connected to the cathode of the avalanche diode, and a gate of the resistive transistor configured to receive a fixed voltage signal;
a first switch transistor, a drain of the first switch transistor connected to a source of the resistive transistor, a gate of the first switch transistor configured to receive an exposure signal, and a source of the first switch transistor connected to a system voltage;
a pull up transistor, a gate of the pull up transistor connected to the cathode of the avalanche diode, and a source of the pull up transistor connected to the system voltage; and
a second switch transistor, a gate of the second switch transistor configured to receive the exposure signal, a source of the second switch transistor connected to a drain of the pull up transistor, and a drain of the second switch transistor configured to generate an output voltage; and
a plurality of readout lines each being coupled to the drain of the second switch transistor of each pixel circuit of one pixel circuit column to output the output voltage.

10. The image sensor as claimed in claim 9, wherein the resistive transistor, the first switch transistor, the pull up transistor and the second switch transistor are P-type transistors.

11. The image sensor as claimed in claim 10, wherein the photon event is the drain of the second switch transistor being connected to the system voltage via the second switch transistor and the pull up transistor to generate a positive pulse on the output voltage.

12. The image sensor as claimed in claim 9, further comprising a plurality of pulling circuits and a global current source circuit, which is configured to form a current mirror with each of the pulling circuits, wherein each of the pulling circuits is coupled to the each readout line for pulling down the output voltage after a photon event of the output voltage is read.

13. The image sensor as claimed in claim 12, wherein the global current source circuit is coupled to different pulling circuits via a multiplexer or via different switching devices.

14. The image sensor as claimed in claim 9, further comprising a plurality of counters each being coupled to the one pixel circuit column and configured to count photon events of the output voltage.

15. The image sensor as claimed in claim 9, wherein
the exposure signal is a row selection signal, and
the fixed voltage signal is used to determine resistance of the resistive transistor.

16. The image sensor as claimed in claim 12, wherein each of the pulling circuits is coupled to the each pixel circuit of the one pixel circuit column further via a switching device or a multiplexer.

17. An image sensor, comprising:
a pixel array comprising a plurality of pixel circuits arranged in a matrix, each of the pixel circuits comprising:
an avalanche diode having an anode and a cathode, the cathode being connected to a positive bias voltage;
a first transistor, a gate of the first transistor connected to the anode of the avalanche diode, and a source of the first transistor connected to a ground voltage; and
a second transistor, a gate of the second transistor configured to receive an exposure signal, a source of the second transistor connected to a drain of the first transistor, and a drain of the second transistor configured to generate an output voltage; and
a plurality of readout lines each being coupled to the drain of the second transistor of each pixel circuit of one pixel circuit column to output the output voltage.

18. The image sensor as claimed in claim 17, further comprising a plurality of pulling circuits and a global current source circuit, which is configured to form a current mirror with each of the pulling circuits, wherein each of the pulling circuits is coupled to each readout line for pulling up the output voltage after a photon event of the output voltage is read.

19. The image sensor as claimed in claim 17, further comprising a plurality of counters each being coupled to the one pixel circuit column and configured to count photon events of the output voltage.

* * * * *